US011749692B2

(12) United States Patent
He et al.

(10) Patent No.: US 11,749,692 B2
(45) Date of Patent: Sep. 5, 2023

(54) DISPLAY PANEL AND DISPLAY DEVICE

(71) Applicant: Xiamen Tianma Micro-Electronics Co., Ltd., Xiamen (CN)

(72) Inventors: Shui He, Xiamen (CN); Ping An, Shanghai (CN); Yaqi Kuang, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 92 days.

(21) Appl. No.: 17/364,771

(22) Filed: Jun. 30, 2021

(65) Prior Publication Data
US 2021/0327924 A1 Oct. 21, 2021

(30) Foreign Application Priority Data
Dec. 30, 2020 (CN) .......................... 202011615429.3

(51) Int. Cl.
*H01L 27/12* (2006.01)
(52) U.S. Cl.
CPC ...... *H01L 27/1248* (2013.01); *H01L 27/1225* (2013.01); *H01L 27/1251* (2013.01)
(58) Field of Classification Search
CPC ............. H01L 27/1248; H01L 27/1225; H01L 27/1251
See application file for complete search history.

(56) References Cited

U.S. PATENT DOCUMENTS

| 10,824,211 | B2 * | 11/2020 | Hanada | .................. | H02J 13/00 |
| 10,950,678 | B2 * | 3/2021 | Kim | ................. | H01L 29/42384 |
| 11,328,665 | B2 * | 5/2022 | Lee | ...................... | G09G 3/3266 |
| 2017/0110528 | A1 * | 4/2017 | Kim | ................. | H01L 29/78633 |
| 2019/0041932 | A1 * | 2/2019 | Hanada | ............... | H01L 27/1251 |
| 2021/0241689 | A1 * | 8/2021 | Lee | ...................... | G09G 3/3233 |
| 2022/0208929 | A1 * | 6/2022 | Min | .................... | H01L 27/3276 |

FOREIGN PATENT DOCUMENTS

| CN | 102683422 A | 9/2012 |
| CN | 107819005 A | 3/2018 |

* cited by examiner

*Primary Examiner* — Nikolay K Yushin
(74) *Attorney, Agent, or Firm* — Alston & Bird LLP

(57) ABSTRACT

Provided are a display panel and a display device. The display panel includes a base substrate; a first transistor and a second transistor, where the first transistor and the second transistor are formed on the base substrate, the first transistor includes a first active layer, a first gate, a first source, and a first drain, the first active layer contains silicon, the second transistor includes a second active layer, a second gate, a second source, and a second drain, and the second active layer contains an oxide semiconductor and is disposed on one side of the first active layer facing away from the base substrate; and a first insulating layer and a second insulating layer, where the first insulating layer is disposed on one side of the second active layer facing away from the base substrate and between the second gate and the second active layer.

20 Claims, 6 Drawing Sheets

DISPLAY PANEL AND DISPLAY DEVICE

CROSS-REFERENCES TO RELATED APPLICATIONS

This application claims the priority to a Chinese patent application No. CN 202011615429.3 filed at the CNIPA on Dec. 30, 2020, disclosure of which is incorporated herein by reference in its entirety.

TECHNICAL FIELD

Embodiments of the present disclosure relate to the field of display technologies and, in particular, to a display panel and a display device.

BACKGROUND

The organic light-emitting diode (OLED) display panel is widely popular with people due to its advantages of self-illumination, high contrast, thin thickness, fast reaction speed and applicableness to a flexible panel.

The OLED element of the OLED display panel is a current-driven element and thus needs to be provided with a corresponding pixel circuit and a corresponding driver circuit. The driver circuit provides a drive signal for the pixel circuit so that the pixel circuit provides a drive current for the OLED element to drive the OLED element to emit light. The driver circuit and the pixel circuit of the OLED display panel are each provided with a transistor. The transistor is often manufactured using indium gallium zinc oxide (IGZO) to serve as an active layer so as to reduce the leakage current in the transistor. However, in the related art, the poor stability of the IGZO transistor further affects the performance of the driver circuit and/or the pixel circuit, and the display effect of the display panel is affected.

SUMMARY

Embodiments of the present disclosure provide a display panel and a display device to improve the stability of a second transistor and ensure the good performance of the driver circuit.

In a first aspect, an embodiment of the present disclosure provides a display panel. The display panel includes a base substrate, a first transistor, a second transistor, a first insulating layer, and a second insulating layer.

The first transistor and the second transistor are formed on the base substrate, the first transistor includes a first active layer, a first gate, a first source, and a first drain, and the first active layer contains silicon. The second transistor includes a second active layer, a second gate, a second source, and a second drain, and the second active layer contains an oxide semiconductor and is disposed on one side of the first active layer facing away from the base substrate.

The first insulating layer is disposed on one side of the second active layer facing away from the base substrate and between the second gate and the second active layer, and the second insulating layer is disposed on one side of the second active layer facing towards the base substrate.

A concentration of oxygen in the first insulating layer is lower than a concentration of oxygen in the second insulating layer.

The display panel includes a pixel circuit and a driver circuit providing a drive signal for the pixel circuit, where the driver circuit includes the second transistor, and the pixel circuit includes the first transistor or the driver circuit includes the first transistor.

In a second aspect, an embodiment of the present disclosure further provides a display device including the display panel described in the first aspect.

The display panel provided by the embodiment of the present disclosure includes the first transistor and the second transistor. The first active layer of the first transistor contains silicon, and the second active layer of the second transistor contains an oxide semiconductor. The first insulating layer is located on the side of the second active layer facing away from the base substrate, and the second insulating layer is located on the side of the second active layer facing towards the base substrate. The concentration of oxygen in the first insulating layer is lower than the concentration of oxygen in the second insulating layer, that is, the concentration of oxygen in the first insulating layer is appropriately reduced, so that the second active layer is prevented from being affected by the deficiency in the first insulating layer; meanwhile, the concentration of oxygen in the second insulating layer is appropriately increased, so that the normal function of the second active layer is ensured. Therefore, the stability of the second transistor is improved, and the good performance of the driver circuit is ensured.

DETAILED DESCRIPTION

Figure 1:
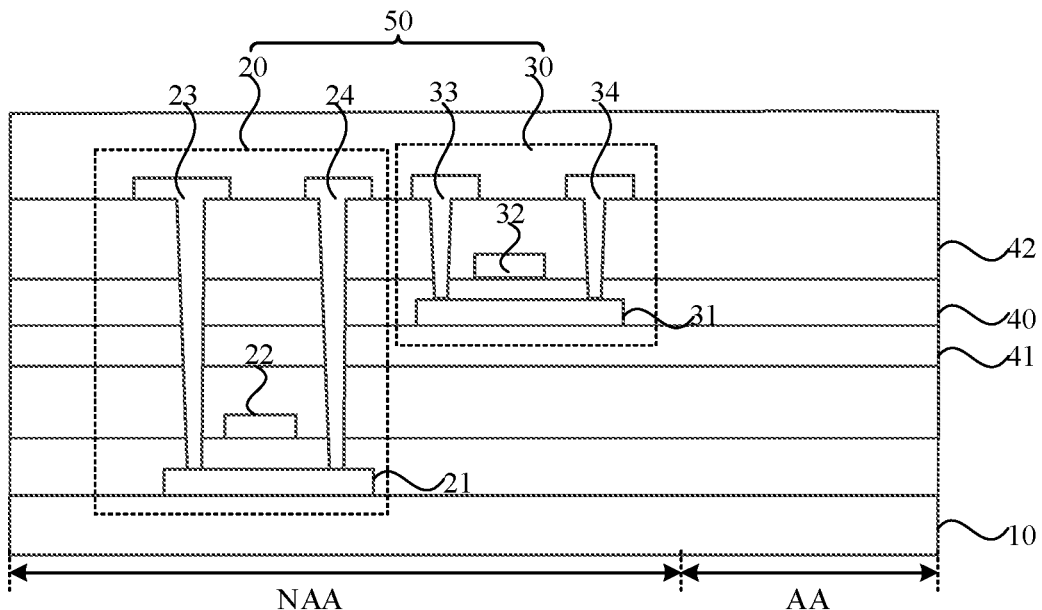
FIG. 1 is a diagram showing structures of a display panel according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

FIG. 1 is a diagram showing structures of a display panel according to an embodiment of the present disclosure. As shown in FIG. 1, a display panel 100 provided by the embodiment of the present disclosure includes a base substrate 10, a first transistor 20, a second transistor 30, a first insulating layer 40, and a second insulating layer 41. The first transistor 20 and the second transistor 30 are formed on the base substrate 10. The first transistor 20 includes a first active layer 21, a first gate 22, a first source 23, and a first drain 24. The first active layer 21 contains silicon. The second transistor 30 includes a second active layer 31, a second gate 32, a second source 33, and a second drain 34. The second active layer 31 contains an oxide semiconductor and is disposed on one side of the first active layer 21 facing away from the base substrate 10. The first insulating layer 40 is disposed on one side of the second active layer 31 facing away from the base substrate 10 and between the second gate 32 and the second active layer 31. The second insulating layer 41 is disposed on one side of the second active layer 31 facing towards the base substrate 10. The concentration of oxygen in the first insulating layer 40 is lower than the concentration of oxygen in the second insulating layer 41. The display panel 100 includes a pixel circuit (not shown in FIG. 1) and a driver circuit 50 providing a drive signal for the pixel circuit. The driver circuit 50 includes at least one second transistor 30. FIG. 1 is illustrated by using an example in which the driver circuit 50 includes both the first transistor 20 and the second transistor 30.

The exemplary display panel 100 includes a display region AA and a non-display region NAA. The non-display region NAA is disposed on at least one side of the display region AA. FIG. 1 is illustrated by using an example in which the non-display region NAA is located on one side of the display region AA, where the driver circuit 50 is located in the non-display region NAA. The driver circuit 50 provides a drive signal for the pixel circuit (not shown in FIG. 1) in the display region AA to cause the pixel circuit to drive a light-emitting element which is located in the same sub-pixel as the pixel circuit to emit light, thereby implementing the display of the display panel 100.

It is to be noted that in the present application, the first transistor 20 and the second transistor 30 may be transistors in the driver circuit, that is, the driver circuit 50 includes the first transistor 20 or the second transistor 30. Additionally, the first transistor 20 and the second transistor 30 may be transistors in the pixel circuit, that is, the pixel circuit includes the first transistor 20 or the second transistor 30, for example, when the second transistor 30 is located in the pixel circuit, the second transistor 30 may be a drive transistor or a switch transistor.

The concentration defined in the present application, if not specially required, is the atomic concentration, that is, the atomic content per unit area.

The exemplary driver circuit 50 includes the first transistor 20 and the second transistor 30, where the first transistor 20 may be a bottom-gate transistor or a top-gate transistor. FIG. 1 is illustrated by using an example in which the first transistor 20 is a top-gate transistor, that is, the first gate 22 is disposed on one side of the first active layer 21 facing away from the base substrate 10. Additionally, the second insulating layer 41 is disposed on one side of the first gate 22 facing away from the base substrate 10. The second active layer 31 is disposed on one side of the second insulating layer 41 facing away from the base substrate 10. The first insulating layer 40 is disposed on one side of the second active layer facing away from the base substrate 10. The second gate 32 is disposed on one side of the first insulating layer 40 facing away from the base substrate 10. The first source 23, the first drain 24, the second source 33, and the second drain 34 are all disposed on one side of the second gate 32 facing away from the base substrate 10 and are insulated from the second gate 32. The first source 23, the first drain 24, the second source 33, and the second drain 34 are disposed in the same layer so that the process steps can be simplified. Additionally, the first active layer 21 in the first transistor 20 contains silicon, optionally poly-silicon, that is, the first active layer 21 is a poly-silicon active layer such as a low temperature poly-silicon (LTPS) active layer. The second active layer 31 in the second transistor 30 includes an oxide semiconductor, that is, the second active layer 31 is an oxide semiconductor active layer such as an IGZO active layer. The LTPS thin-film transistor has the advantages of high carrier mobility, fast response, and low power consumption, and the oxide semiconductor thin-film transistor has the advantage of low leakage current. When the driver circuit 50 includes the first transistor 20 and the second transistor 30, the driver circuit 50 has the advantages of high carrier mobility, fast response, low power consumption, and low leakage current, thereby ensuring the good performance of the driver circuit 50 and improving the display performance of the display panel 100.

Furthermore, the concentration of oxygen in the first insulating layer 40 is lower than the concentration of oxygen in the second insulating layer 41. On one hand, the concentration of oxygen in the first insulating layer 40 is appropriately reduced, so that when the first insulating layer 40 is used as a gate insulating layer, a deficiency caused by existence of a dangling bond in oxygen in the film forming process is avoided, and the problem that the existence of the deficiency affects the stability of the second transistor 30 is further avoided. On the other hand, the concentration of oxygen in the second insulating layer 41 is appropriately increased, so that the second active layer 31 containing the oxide semiconductor is supplemented with oxygen, and the normal function of the second active layer 31 is ensured. That is, in this embodiment, the concentration of oxygen in the first insulating layer 40 is lower than the concentration of oxygen in the second insulating layer 41, so that the stability of the second transistor 30 can be improved without affecting the normal function of the second transistor 30, thereby ensuring good performance of the driver circuit 50.

It is to be noted that since the first insulating layer 40 is located on the side of the second active layer 31 facing away from the base substrate 10 and between the second gate 32 and the second active layer 31 and the second insulating layer 41 is located on the side of the second active layer 31 facing towards the base substrate 10, the first insulating layer 40 and the second insulating layer 41 may be in direct contact with the second active layer 31, which is shown in FIG. 1. Alternatively, the first insulating layer 40 and/or the second insulating layer 41 may not be in direct contact with the second active layer 31. That is, other insulating layers are provided between the first insulating layer 40 and the second active layer 31 without affecting the performance of the second transistor 30, and/or other insulating layers are provided between the second insulating layer 41 and the second active layer 31, which is not specifically limited in this embodiment.

In summary, the display panel provided by the embodiment of the present disclosure includes the first transistor and the second transistor. The first active layer of the first transistor contains silicon, and the second active layer of the second transistor contains an oxide semiconductor. The first insulating layer is located on the side of the second active layer facing away from the base substrate, and the second insulating layer is located on the side of the second active layer facing towards the base substrate. The concentration of oxygen in the first insulating layer is lower than the concentration of oxygen in the second insulating layer, that is, the concentration of oxygen in the first insulating layer is appropriately reduced, so that the second active layer is prevented from being affected by the deficiency in the first insulating layer; meanwhile, the concentration of oxygen in the second insulating layer is appropriately increased, so that the normal function of the second active layer is ensured. Therefore, the stability of the second transistor is improved, and the good performance of the driver circuit is ensured.

Optionally, A denotes a ratio of the concentration of oxygen to a concentration of silicon in the first insulating layer 40, and B denotes a ratio of the concentration of oxygen to a concentration of silicon in the second insulating layer 41, where A<B.

The first insulating layer 40 and the second insulating layer 41 each include oxygen and silicon, for example, silicon oxide, but the materials of the first insulating layer 40 and the second insulating layer 41 are not specifically limited in this embodiment, and those skilled in the art may select the materials according to actual situations, so long as the first insulating layer 40 and the second insulating layer 41 each include oxygen and silicon.

Oxygen atoms and silicon atoms in the first insulating layer 40 and the second insulating layer 41 need to be bonded. In this embodiment, the ratio of the concentration of oxygen to the concentration of silicon in the first insulating layer 40 is appropriately reduced, so that the phenomenon of existence of dangling bonds in oxygen in the film forming process of the first insulating layer 40 can be reduced, and the stability of the second transistor 30 can be ensured. Moreover, the phenomenon of existence of dangling bonds in oxygen is prevented from getting more serious when the ratio of the concentration of oxygen to the concentration of silicon is large, and thus deficiencies are prevented from getting more and capturing and affecting the carriers in the second transistor 30. The problem of affecting the stability of the second transistor 30 is thus avoided.

Optionally, the first insulating layer 40 includes silicon oxide $SiO_x$, and the second insulating layer 41 includes silicon oxide $SiO_y$. Where x is a ratio of the number of oxygen atoms to the number of silicon atoms in the first insulating layer 40, y is a ratio of the number of oxygen atoms to the number of silicon atoms in the second insulating layer 41, and x<y. That is, when the first insulating layer 40 and the second insulating layer 41 each include silicon oxide, the ratio of the concentration of oxygen to the concentration of silicon in the first insulating layer 40 is appropriately reduced, so that the phenomenon of existence of dangling bonds in oxygen in the film forming process of the first insulating layer 40 can be reduced, and the stability of the second transistor 30 can be ensured. Moreover, the phenomenon of existence of dangling bonds in oxygen is prevented from getting more serious when the ratio of the concentration of oxygen to the concentration of silicon is large, and thus deficiencies are prevented from getting more and capturing and affecting the carriers in the second transistor 30. The problem of affecting the stability of the second transistor 30 is thus avoided.

Figure 2:
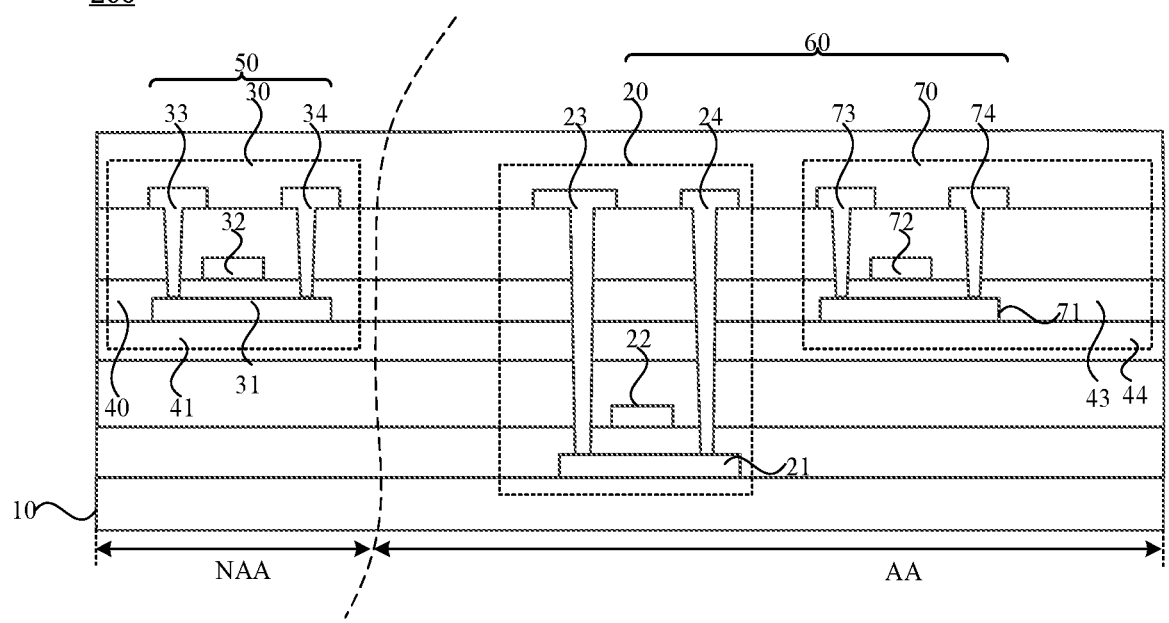
FIG. 2 is a diagram showing structures of a display panel according to another embodiment of the present disclosure.
Figure 4:
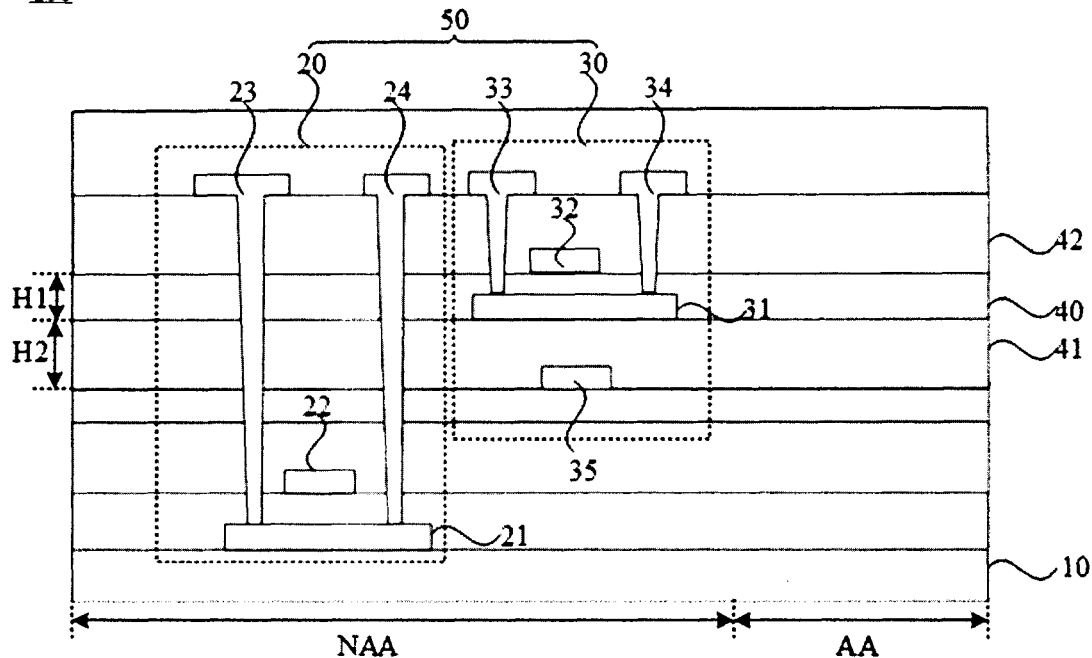
FIG. 4 is a diagram showing structures of a display panel according to another embodiment of the present disclosure.

FIG. 2 is a diagram showing structures of a display panel according to another embodiment of the present disclosure. As shown in FIG. 2, a pixel circuit 60 further includes a third transistor 70. The third transistor 70 includes a third active layer 71, a third source 73, a third drain 74, and a fourth gate 72, and the third active layer 71 contains an oxide semiconductor. The display panel 200 further includes a fourth insulating layer 43 and a fifth insulating layer 44. The fourth insulating layer 43 is disposed on one side of the third active layer 71 facing away from the base substrate 10 and between the third active layer 71 and the fourth gate 72. The fifth insulating layer 44 is disposed on one side of the third active layer 71 facing towards the base substrate 10. The concentration of oxygen in the fourth insulating layer 43 is lower than the concentration of oxygen in the fifth insulating layer 44. FIG. 4 is illustrated by using an example in which the pixel circuit 60 includes the first transistor 20.

As shown in FIG. 2, the display panel 200 includes a display region AA and a non-display region NAA, the driver circuit 50 is disposed in the non-display region NAA, and the pixel circuit 60 is disposed in the display region AA. The pixel circuit 60 includes the first transistor 20 and the third transistor 70. The third active layer 71 in the third transistor 70 includes an oxide semiconductor, that is, the third active layer 71 is an oxide semiconductor active layer such as an IGZO active layer. The leakage current of the oxide semiconductor thin-film transistor is very low, which can ensure that the leakage current in the working process of the pixel circuit 60 is low. The first active layer 21 in the first transistor 20 contains silicon, optionally poly-silicon, that is, the first active layer 21 is a poly-silicon active layer such as a low temperature poly-silicon (LTPS) active layer. Furthermore, the LTPS thin-film transistor has the advantages of high carrier mobility, fast response, and low power consumption. Therefore, when the pixel circuit 60 includes the first transistor 20 and the third transistor 70, the pixel circuit 60 has the advantages of high carrier mobility, fast response, low power consumption, and low leakage current, thereby ensuring the good performance of the pixel circuit 60 and improving the display performance of the display panel 200. In addition, in this embodiment, the second transistor 30 in the driver circuit 50 is an oxide semiconductor transistor and the third transistor 70 in the pixel circuit 60 is an oxide semiconductor transistor, so that good performance of the driver circuit 50 and the pixel circuit 60 is ensured, and the display performance of the display panel 200 is further improved.

Furthermore, in this embodiment, the concentration of oxygen in the fourth insulating layer 43 is lower than the concentration of oxygen in the fifth insulating layer 44. On one hand, the concentration of oxygen in the fourth insulating layer 43 is appropriately reduced, so that when the fourth insulating layer 43 is used as a gate insulating layer, a deficiency caused by existence of a dangling bond in oxygen in the film forming process is avoided, and the problem that the existence of the deficiency affects the stability of the third transistor 70 is further avoided. On the other hand, the concentration of oxygen in the fifth insulating layer 44 is appropriately increased, so that the third active layer 71 containing the oxide semiconductor is supplemented with oxygen, and the normal function of the third active layer 71 is ensured. That is, in this embodiment, the concentration of oxygen in the fourth insulating layer 43 is lower than the concentration of oxygen in the fifth insulating layer 44, so that the stability of the third transistor 70 can be improved without affecting the normal function of the third transistor 70, thereby ensuring good performance of the pixel circuit 60.

It is to be noted that the fourth insulating layer 43 may be disposed in the same layer as the first insulating layer 40, and the fifth insulating layer 44 may be disposed in the same layer as the second insulating layer 41; or the fourth insulating layer 43 is not disposed in the same layer as the first insulating layer 40, and the fifth insulating layer 44 is not disposed in the same layer as the second insulating layer 41. FIG. 4 is illustrated by using an example in which the fourth insulating layer 43 is disposed in the same layer as the first insulating layer 40 and the fifth insulating layer 44 is disposed in the same layer as the second insulating layer 41. Additionally, in this embodiment, the third source 73 and the third drain 74 in the third transistor 70 are disposed in the same layer as the second source 33 and the second drain 34 in the second transistor 30 and the first source 23 and the first drain 24 in the first transistor 20, thereby simplifying the process steps and improving the manufacturing efficiency of the display panel.

On the basis of the preceding scheme, optionally, the third transistor 70 is a switch transistor of the pixel circuit 60, R1 denotes a difference between a concentration C1 of oxygen in the first insulating layer 40 and a concentration C2 of oxygen in the second insulating layer 41 and satisfies R1=C2−C1, and R2 denotes a difference between a concentration C4 of oxygen in the fourth insulating layer 43 and a concentration C5 of oxygen in the fifth insulating layer 44 is R2=C5−C4, where R1≥R2.

The pixel circuit 60 is sometimes applied to a low-frequency driving mode. When the pixel circuit 60 is applied to the low-frequency driving mode, a switch transistor in the pixel circuit 60 is in an off-state for a long time, while a transistor in the driver circuit 50 is turned on more frequently. In the driver circuit 50, the difference between the concentration of oxygen in the first insulating layer 40 and the concentration of oxygen in the second insulating layer 41 is appropriately increased, that is, the concentration of oxygen in the first insulating layer 40 is lower, so that the influence of deficiencies on the second transistor 30 is reduced; the concentration of oxygen in the second insulating layer 41 is higher, so that the second active layer 31 is supplemented with sufficient oxygen, and the driver circuit 50 has high stability. Thus, even if the second transistor 30 in the driver circuit 50 turns on frequently, the overall characteristics of the driver circuit 50 can be ensured to be good.

Optionally, the third transistor 70 is a switch transistor of the pixel circuit 60, and the concentration of oxygen in the first insulating layer 40 is lower than the concentration of oxygen in the fourth insulating layer 43. That is, the concentration of oxygen in the first insulating layer 40 in the second transistor 30 of the driver circuit 50 is much lower, so that when the first insulating layer 40 is used as the gate insulating layer, a deficiency caused by existence of a dangling bond in oxygen in the film forming process is avoided, and the problem that the existence of the deficiency affects the stability of the second transistor 30 is further avoided. Thus, the second transistor 30 is ensured to have high stability, and even if the second transistor 30 in the driver circuit 50 turns on frequently, the overall characteristics of the driver circuit 50 can also be ensured to be good.

It is to be noted that when the first insulating layer 40 and the fourth insulating layer 43 are disposed in the same film layer, for example, different concentrations of oxygen may be implanted into the first insulating layer 40 and the fourth insulating layer 43 by the ion implantation process so that the concentration of oxygen in the first insulating layer 40 is lower than the concentration of oxygen in the fourth insulating layer 43.

Optionally, the third transistor 70 is a drive transistor of the pixel circuit 60, R1 denotes a difference between a concentration C1 of oxygen in the first insulating layer 40 and a concentration C2 of oxygen in the second insulating layer 41 and satisfies R1=C2−C1, and R2 denotes a difference between a concentration C4 of oxygen in the fourth insulating layer 43 and a concentration C5 of oxygen in the fifth insulating layer 44 and satisfies R2=C5−C4, where R1≤R2.

The pixel circuit 60 is sometimes applied to a low-frequency driving mode. When the pixel circuit 60 is applied to the low-frequency driving mode, a drive transistor in the pixel circuit 60 is in an on state longer than a transistor in the driver circuit 50. In the pixel circuit 60, the difference between the concentration of oxygen in the fourth insulating layer 43 and the concentration of oxygen in the fifth insulating layer 44 is large, that is, the concentration of oxygen in the fourth insulating layer 43 is much lower, so that the influence of deficiencies on the third transistor 70 is reduced; the concentration of oxygen in the fifth insulating layer 44 is higher, so that the third active layer 71 is supplemented with sufficient oxygen, and the third transistor 70 is ensured to have high stability. Thus, even if the third transistor 70 in the pixel circuit 60 is in the on state for a long time, the overall characteristics of the pixel circuit 60 can also be ensured to be good.

Optionally, the third transistor 70 is a drive transistor of the pixel circuit 60; the concentration of oxygen in the first insulating layer 40 is higher than the concentration of oxygen in the fourth insulating layer 43. That is, the concentration of oxygen in the fourth insulating layer 43 in the third transistor 70 of the pixel circuit 60 is lower, so that when the fourth insulating layer 43 is used as the gate insulating layer, a deficiency caused by existence of a dangling bond in oxygen in the film forming process is avoided, and the problem that the existence of the deficiency affects the stability of the third transistor 70 is further avoided. Thus, the third transistor 70 is ensured to have high stability, and even if the third transistor 70 in the pixel circuit 60 is in the on state for a longer time, the overall characteristics of the pixel circuit 60 can also be ensured to be good. In this case, when the first insulating layer 40 and the fourth insulating layer 43 are disposed in the same film layer, different concentrations of oxygen may also be implanted into the first insulating layer 40 and the fourth insulating layer 43 by the ion implantation process so that the concentration of oxygen in the first insulating layer 40 is higher than the concentration of oxygen in the fourth insulating layer 43.

Figure 3:
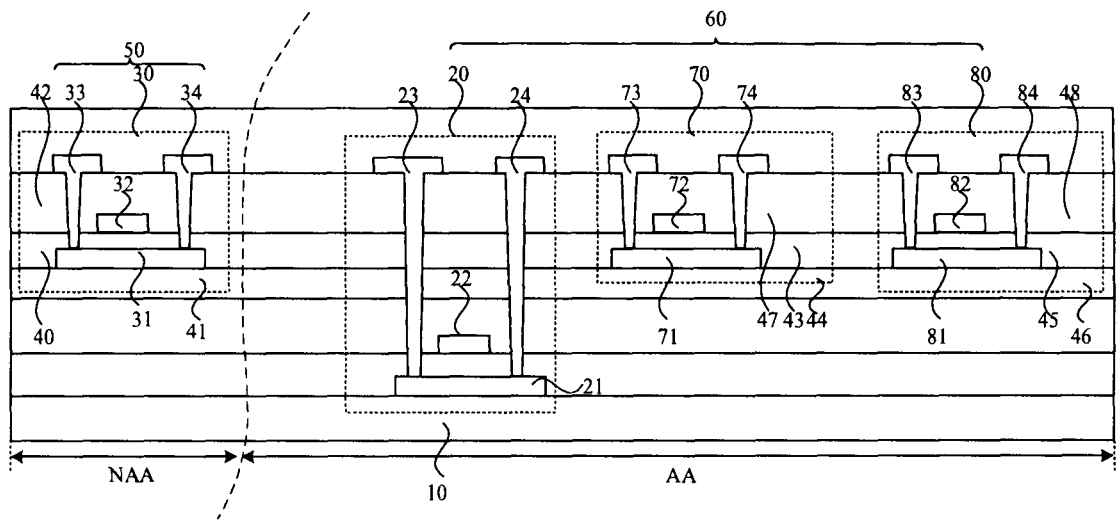
FIG. 3 is a diagram showing structures of a display panel according to another embodiment of the present disclosure.

FIG. 3 is a diagram showing structures of a display panel according to another embodiment of the present disclosure. As shown in FIG. 3, the display panel 300 further includes a fourth transistor 80. The fourth transistor 80 includes a fourth active layer 81, a fourth source 83, a fourth drain 84, and a fifth gate 82. The fourth active layer 81 contains an oxide semiconductor. The display panel 300 further includes a sixth insulating layer 45 and a seventh insulating layer 46. The sixth insulating layer 45 is disposed on one side of the fourth active layer 81 facing away from the base substrate 10 and between the fourth active layer 81 and the fifth gate 82. The seventh insulating layer 46 is disposed on one side of the fourth active layer 81 facing towards the base substrate 10. The concentration of oxygen in the sixth insulating layer 45 is lower than the concentration of oxygen in the seventh insulating layer 46.

It is to be noted that when the display panel 300 includes the fourth transistor 80, the fourth transistor 80 may be a transistor in the driver circuit 50 or a transistor in the pixel circuit 60, which is not specifically limited in this embodiment. FIG. 3 is illustrated by using an example in which the fourth transistor 80 is a transistor in the pixel circuit 60. Additionally, the specific structure of the pixel circuit 60 is not limited in this embodiment. The pixel circuit 60 may include, for example, seven transistors (7T) or nine transistors (9T).

Specifically, the pixel circuit 60 further includes the fourth transistor 80. The fourth active layer 81 in the fourth transistor 80 may also be an oxide semiconductor active layer such as an IGZO active layer. That is, the two transistors in the pixel circuit 60 in this embodiment are each an oxide semiconductor transistor, so that a leakage current is ensured in the working process of the pixel circuit 60, and the performance of the pixel circuit 60 is ensured to be good. Additionally, in this embodiment, the concentration of oxygen in the sixth insulating layer 45 is lower than the concentration of oxygen in the seventh insulating layer 46. On one hand, the concentration of oxygen in the sixth insulating layer 45 is appropriately reduced, so that when the sixth insulating layer 45 is used as a gate insulating layer, a deficiency caused by existence of a dangling bond in oxygen in the film forming process is avoided, and the problem that the existence of the deficiency affects the stability of the fourth transistor 80 is further avoided. On the other hand, the concentration of oxygen in the seventh insulating layer 46 is appropriately increased, so that the fourth active layer 41 containing the oxide semiconductor is supplemented with oxygen, and the normal function of the fourth active layer 41 is ensured. That is, in this embodiment, the concentration of oxygen in the sixth insulating layer 45 is lower than the concentration of oxygen in the seventh insulating layer 46, so that the stability of the fourth transistor 80 can be improved without affecting the normal function of the fourth transistor 80, thereby ensuring good performance of the pixel circuit 60.

It is to be noted that the sixth insulating layer 45, the fourth insulating layer 43, and the first insulating layer 40 may be disposed in the same film layer or different film layers, or any two of the above layers may be disposed in the same film layer. Similarly, the seventh insulating layer 46, the fifth insulating layer 44, and the second insulating layer 41 may be disposed in the same film layer or different film layers, or any two of the above layers may be disposed in the same film layer. FIG. 3 is illustrated by using an example in which the sixth insulating layer 45, the fourth insulating layer 43, and the first insulating layer 40 are disposed in the same layer and the seventh insulating layer 46, the fifth insulating layer 44, and the second insulating layer 41 are disposed in the same layer. Additionally, in this embodiment, the fourth source 83 and the fourth drain 84 in the fourth transistor 80 are disposed in the same layer as the third source 73 and the third drain 74 in the third transistor 70, the second source 33 and the second drain 34 in the second transistor 30, and the first source 23 and the first drain 24 in the first transistor 30, thereby simplifying the process steps and improving the manufacturing efficiency of the display panel.

On the basis of the preceding scheme, optionally, the third transistor 70 is a drive transistor of the pixel circuit 60, and the fourth transistor 80 is a switch transistor of the pixel circuit 60. Where R2 denotes a difference between a concentration C4 of oxygen in the fourth insulating layer 43 and a concentration C5 of oxygen in the fifth insulating layer 44 and satisfies R2=C5−C4, and R3 denotes a difference between a concentration C6 of oxygen in the sixth insulating layer 45 and a concentration C7 of oxygen in the seventh insulating layer 46 and satisfies R3=C7−C6, where R2≥R3.

Generally speaking, in a pixel circuit, a transistor having a gate connected to a scan signal or a light emission control signal is a switch transistor, transistors except the switch transistor in the pixel circuit are drive transistors which are connected in series on the transmission path between a first power signal (e.g. PVDD signal) and a second power signal (e.g. PVEE signal), and a data signal is written into the gate of the drive transistor. As the data signal is written, the potential of the gate of the drive transistor changes. The pixel circuit is sometimes applied to a low-frequency driving mode. When the pixel circuit is applied to the low-frequency driving mode, a drive transistor is in an on state longer than a switch transistor in the pixel circuit. In the pixel circuit 60 in this embodiment, the difference between the concentration of oxygen in the fourth insulating layer 43 and the concentration of oxygen in the fifth insulating layer 44 is large, that is, the concentration of oxygen in the fourth insulating layer 43 is lower, so that the influence of deficiencies on the third transistor 70 is reduced. The concentration of oxygen in the fifth insulating layer 44 is higher, so that the third active layer 71 is supplemented with sufficient oxygen, and the third transistor 70 is ensured to have high stability. Thus, even if the third transistor 70 in the pixel circuit 60 is in the on state for a long time, the overall characteristics of the pixel circuit 60 can also be ensured to be good.

Optionally, the third transistor 70 is a drive transistor of the pixel circuit 60, and the fourth transistor 80 is a switch transistor of the pixel circuit 60. The concentration of oxygen in the fourth insulating layer 43 is lower than the concentration of oxygen in the sixth insulating layer 45. That is, the concentration of oxygen in the fourth insulating layer 43 in the third transistor 70 of the pixel circuit 60 is lower, so that when the fourth insulating layer 43 is used as the gate insulating layer, a deficiency caused by existence of a dangling bond in oxygen in the film forming process is avoided, and the problem that the existence of the deficiency affects the stability of the third transistor 70 is further avoided. Thus, the third transistor 70 is ensured to have high stability, and even if the third transistor 70 in the pixel circuit 60 is in the on state for a longer time, the overall characteristics of the pixel circuit 60 can also be ensured to be good. Similarly, when the fourth insulating layer 43 and the sixth insulating layer 45 are disposed in the same film layer, the concentration of oxygen in the fourth insulating layer 43 may be made different from the concentration of oxygen in the sixth insulating layer 45 by the ion implantation process.

Optionally, with continued reference to FIG. 1, the display panel 100 further includes a third insulating layer 42 disposed on one side of the second gate 32 facing away from the base substrate 10, where a concentration of oxygen in the third insulating layer 42 is higher than the concentration of oxygen in the first insulating layer 40.

The third insulating layer 42 is an insulating layer on the side of the second gate 32 facing away from the base substrate 10. The concentration of oxygen in the third insulating layer 42 is appropriately increased, so that the density of the third insulating layer 42 is increased. Therefore, the second transistor 30 is protected by the third insulating layer 42, and external water and oxygen, hydrogen and other elements are prevented from entering the second transistor 30 to affect the performance of the second transistor 30.

Optionally, A denotes a ratio of the concentration of oxygen to a concentration of silicon in the first insulating layer 40, and C denotes a ratio of the concentration of oxygen to a concentration of silicon in the third insulating layer 42, where A<C. When the first insulating layer 40 and the second insulating layer 41 each include oxygen and silicon, the ratio of the concentration of oxygen to the concentration of silicon in the third insulating layer 42 is increased, so that the second transistor 30 is protected, avoiding a reduction in the density of the third insulating layer 42 due to too low a concentration of oxygen and too high a concentration of silicon in the third insulating layer 42, thereby avoiding influence on the ability of the third insulating layer 42 to protect the second transistor 30.

Optionally, the concentration of oxygen in the third insulating layer 42 is lower than the concentration of oxygen in the second insulating layer 41. That is, the concentration of oxygen in the third insulating layer 42 is higher than the concentration of oxygen in the first insulating layer 40 so as to protect the second transistor 30, but compared with the concentration of oxygen in the second insulating layer 41, the concentration of oxygen in the third insulating layer 42 is still lower than the concentration of oxygen in the second insulating layer 414. That is, the concentration of oxygen in the second insulating layer 41 is higher, so that the second active layer 31 including the oxide semiconductor is supplemented with oxygen, and the normal function of the second active layer 31 is ensured.

Optionally, B denotes a ratio of the concentration of oxygen to a concentration of silicon in the second insulating layer 41, and C denotes a ratio of the concentration of oxygen to a concentration of silicon in the third insulating layer 42, where B>C. That is, when the second insulating layer 41 and the third insulating layer 42 each include oxygen and silicon, the ratio of the concentration of oxygen to the concentration of silicon in the second insulating layer 41 is increased, so that the second active layer 31 including the oxide semiconductor is supplemented with oxygen, and the normal function of the second active layer 31 is ensured.

Optionally, A denotes a ratio of the concentration of oxygen to a concentration of silicon in the first insulating layer 40, B denotes a ratio of the concentration of oxygen to a concentration of silicon in the second insulating layer 41, and C denotes a ratio of the concentration of oxygen to a concentration of silicon in the third insulating layer 42, where $(B-1) \leq 2(C-1)-(A-1)$. That is, $(B-1) \leq 2(C-1)-(A-1)$, so that the concentration of oxygen to a concentration of silicon in the first insulating layer 40 is lower, and thus the stability of the second transistor 30 can be improved. A deficiency is avoided caused by existence of a dangling bond in oxygen in the film forming process when the first insulating layer 40 is used as a gate insulating layer, and the problem that the existence of the deficiency affects the stability of the second transistor 30 is further avoided.

On the basis of the preceding scheme, optionally, $(B-1)-(C-1) \leq \frac{1}{2} \times [(C-1)-(A-1)]$.

In this embodiment, the ratio of the concentration of oxygen to the concentration of silicon in the first insulating layer 40, the ratio B of the concentration of oxygen to the concentration of silicon in the second insulating layer 41, and the ratio C of the concentration of oxygen to the concentration of silicon in the third insulating layer 42 satisfy that $(B-1)-(C-1) \leq \frac{1}{2} \times [(C-1)-(A-1)]$. Therefore, a deficiency caused by existence of a dangling bond in oxygen in the film forming process of the first insulating layer 40 is reduced, and the problem that the existence of the deficiency affects the stability of the second transistor 30 is avoided. Meanwhile, the second active layer 31 containing the oxide semiconductor is supplemented with oxygen through the second insulating layer 41, and the normal function of the second active layer 31 is ensured. Moreover, the density of the third insulating layer 42 is increased through the sufficient oxygen to protect the second transistor 30 and further improve the stability of the second transistor 30.

It is to be understood that the preceding example is merely illustrated with the setting of concentrations of oxygen in the first insulating layer 40, the second insulating layer 41, and the third insulating layer 43 close to the second transistor 30. However, when the display panel 100 further includes the third transistor 70 and the fourth transistor 80, for example, with continued reference to FIG. 3, the preceding rule is also applicable to the fourth insulating layer 43, the fifth insulating layer 44, and the insulating layer 47 on the side of the fourth insulating layer 43 facing away from the fifth insulating layer 44, and the preceding rule is also applicable to the sixth insulating layer 45, the seventh insulating layer 46, and the insulating layer 48 on the side of the sixth insulating layer 45 facing away from the seventh insulating layer 46. Repetition is not made herein.

The preceding embodiments are each illustrated by using an example in which the second transistor 30 is a top-gate transistor. Optionally, the second transistor 30 may also be a double-gate transistor. When the second transistor 30 is a double-gate transistor, in addition to satisfying the rule of the concentration of oxygen in the insulating layer described in the preceding embodiments, the second transistor 30 may also be individually set according to the characteristics of the double-gate transistor.

FIG. 4 is a diagram showing structures of a display panel 400 according to another embodiment of the present disclosure. As shown in FIG. 4, the second transistor 30 includes a third gate 35 disposed on one side of the second insulating layer 41 facing towards the base substrate 10, where a thickness H1 of the first insulating layer 40 is less than a thickness H2 of the second insulating layer 41.

Specifically, the second transistor 30 includes not only the second gate 32 but also the third gate 35, that is, the second transistor 30 is a double-gate transistor, so that the mobility of carriers in the second transistor 30 can be enhanced, and the response ability of the second transistor 30 can be enhanced. It is to be noted that the second transistor 30 may be an oxide semiconductor transistor and generally speaking, the volume of the oxide semiconductor transistor is large, so it is beneficial to reducing the volume of the second transistor 30 by providing the second transistor 30 as a double-gate transistor with a top gate and a bottom gate stacked. The area of the non-display region NAA where the driver circuit 50 is located is thus reduced, achieving the narrow bezel of the display panel 100. Additionally, the thickness H1 of the first insulating layer 40 is less than the thickness H2 of the second insulating layer 41, that is, the thickness of the insulating layer of a main gate is less than the thickness of the insulating layer of an assist gate, so that the ability of the main gate to control the second transistor 30 is ensured.

When the second transistor 30 includes the third gate 35 located on the side of the second insulating layer 41 facing towards the base substrate 10, optionally, in the second insulating layer 41, the concentration of oxygen on the side facing towards the second active layer 31 is higher than the concentration of oxygen on the side facing away from the second active layer 31.

Such setting has the following advantages: on one hand, in the second insulating layer 41, the concentration of oxygen on the side facing towards the second active layer 31 is higher so that the second active layer 31 containing the oxide semiconductor is supplemented with sufficient oxygen and the normal function of the second active layer 31 is ensured; on the other hand, in the second insulating layer 41, the concentration of oxygen on the side facing away from the second active layer 31 is lower so that a deficiency caused by existence of a dangling bond in oxygen in the film forming process of the second insulating layer 41 is avoided, and the problem that the existence of the deficiency affects the stability of the second transistor 30 is further avoided. Thus, the second transistor 30 is ensured to have good performance.

Figure 5:
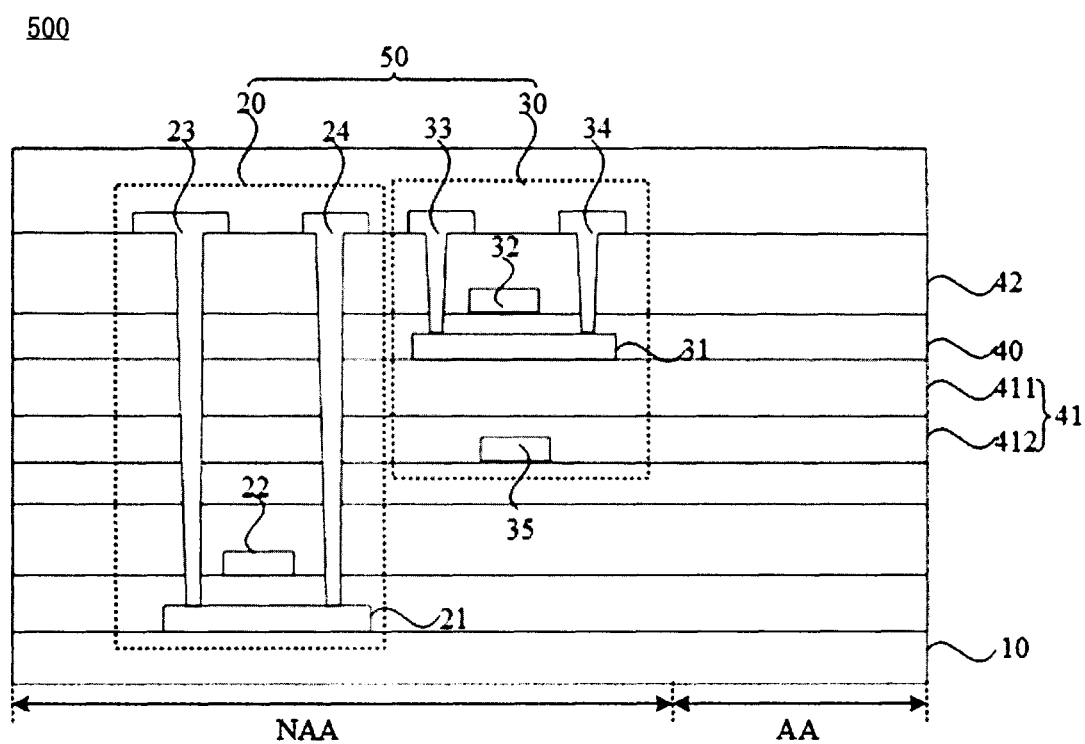
FIG. 5 is a diagram showing structures of a display panel according to another embodiment of the present disclosure.

On the basis of the preceding scheme, FIG. 5 is a diagram showing structures of a display panel 500 according to another embodiment of the present disclosure. As shown in FIG. 5, the second insulating layer 41 includes a first sub-insulating layer 411 and a second sub-insulating layer 412, the second sub-insulating layer 412 is disposed on one side of the first sub-insulating layer 411 facing away from the second active layer 31, and the first sub-insulating layer 411 and the second sub-insulating layer 412 each contains silicon oxide, where a concentration of oxygen in the first sub-insulating layer 411 is higher than a concentration of oxygen in the second sub-insulating layer 412.

In this embodiment, the first sub-insulating layer 411 and the second sub-insulating layer 412 each includes silicon oxide, but concentrations of oxygen in the first sub-insulating layer 411 and the second sub-insulating layer 412 are different, for example, the concentration of oxygen in the first sub-insulating layer 411 is higher than the concentration of oxygen in the second sub-insulating layer 412. That is, the concentration of oxygen in the first sub-insulating layer 411 is appropriately increased, so that the second active layer 31 including the oxide semiconductor is supplemented with sufficient oxygen and the normal function of the second active layer 31 is ensured. Meanwhile, the concentration of oxygen in the second sub-insulating layer 412 is appropriately reduced so that a deficiency caused by existence of a dangling bond in oxygen in the film forming process of the second sub-insulating layer 412 is avoided, and the problem that the existence of the deficiency affects the stability of the second transistor 30 is further avoided. Thus, the second transistor 30 is ensured to have good performance.

On the basis of the preceding scheme, optionally, a concentration of hydrogen in the second sub-insulating layer 412 is higher than a concentration of hydrogen in the first sub-insulating layer 411. The deficiency caused by existence of a dangling bond in oxygen inside the second sub-insulating layer 412 is repaired by hydrogen in the second sub-insulating layer 412, so that the stability of the second transistor 30 is ensured, and the performance of the second transistor 30 is further improved.

It is to be noted that FIG. 5 is illustrated by merely using an example in which the second transistor 30 is a double-gate transistor. In this manner, in FIG. 5, the relationship between the thickness H1 of the first insulating layer 40 and the thickness H2 of the second insulating layer 41 is described, the variation in the concentration of oxygen in the second insulating layer 41 is described, and when the second insulating layer 41 includes the first sub-insulating layer 411 and the second sub-insulating layer 412, the materials of and the concentration relationship of oxygen in the first sub-insulating layer 411 and the second sub-insulating layer 412 are defined, and the concentration relationship of hydrogen in the first sub-insulating layer 411 and the second sub-insulating layer 412 is defined. It is to be understood that when the third transistor 70 is a double-gate transistor, the fourth insulating layer 43 and the fifth insulating layer 44 also satisfy the preceding relationship. When the fourth transistor 80 is a double-gate transistor, the sixth insulating layer 45 and the seventh insulating layer 46 also satisfy the preceding relationship. Repetition is not made herein.

Figure 6:
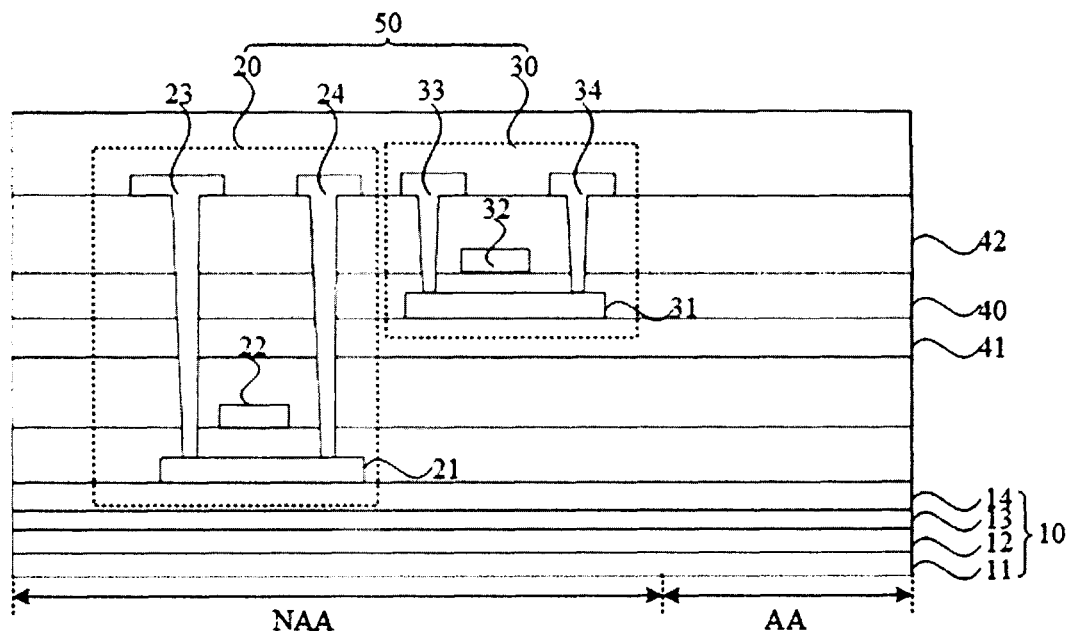
FIG. 6 is a diagram showing structures of a display panel according to another embodiment of the present disclosure.

On the basis of the preceding schemes, FIG. 6 is a diagram showing structures of a display panel 600 according to another embodiment of the present disclosure. As shown in FIG. 6, the base substrate 10 in the embodiment of the present disclosure may be a flexible base substrate or a rigid base substrate, which is not limited in the embodiment of the present disclosure. When the base substrate 10 is a flexible substrate, the base substrate 10 may include a polyimide substrate to ensure that the flexible substrate has good high temperature resistance and good insulation performance. The base substrate 10 may include one layer of polyimide substrate or two layers of polyimide substrates, which is not limited in the embodiment of the present disclosure. When the base substrate 10 includes one layer of polyimide substrate, the film layer of the base substrate 10 has a simple structure and can be manufactured with a simple process, facilitating the implementation of design requirements of the base substrate 10 and the entire display panel being light and thin. When the base substrate 10 includes at least two layers of polyimide substrates, a buffer layer is further provided between the polyimide substrates to enhance adhesion between the polyimide substrates; when the base substrate 10 is formed by polyimide substrates being stacked with the buffer layer, some external impurities and/or water vapor can be prevented from entering into the substrate on the bottom to affect the first active layer 21. Furthermore, since the polyimide substrate is generally manufactured on a rigid substrate, the rigid substrate is generally lift off by the laser lift-off technique after the driver circuit 50, the pixel circuit, and the light-emitting element are manufactured on the base substrate 10. The polyimide substrate may be damaged when the rigid substrate is lift off by laser. Therefore, when the base substrate 10 includes at least two polyimide substrates, for example, including a first polyimide substrate and a second polyimide substrate, a first buffer layer is provided between the first polyimide substrate and the second polyimide substrate, and a second buffer layer is provided between the second polyimide substrate and the first active layer 21. The first polyimide substrate is manufactured on the rigid substrate, and the driver circuit 50 and the pixel circuit are manufactured on the second buffer layer. Therefore, even if the first polyimide substrate may be damaged when the rigid substrate is lift off by laser, the integrity of the second polyimide substrate and the integrity of the second buffer layer on the second polyimide substrate can be ensured, thereby ensuring the integrity of the entire display panel. FIG. 6 is illustrated by merely using an example in which the base substrate 10 is a flexible substrate and includes a first flexible substrate 11 and a second flexible substrate 13, which are polyimides, respectively, as well as a first buffer layer 12 between the first flexible substrate 11 and the second flexible substrate 13 and a second buffer layer 14 between the second flexible substrate 13 and the first active layer 21.

Figure 7:
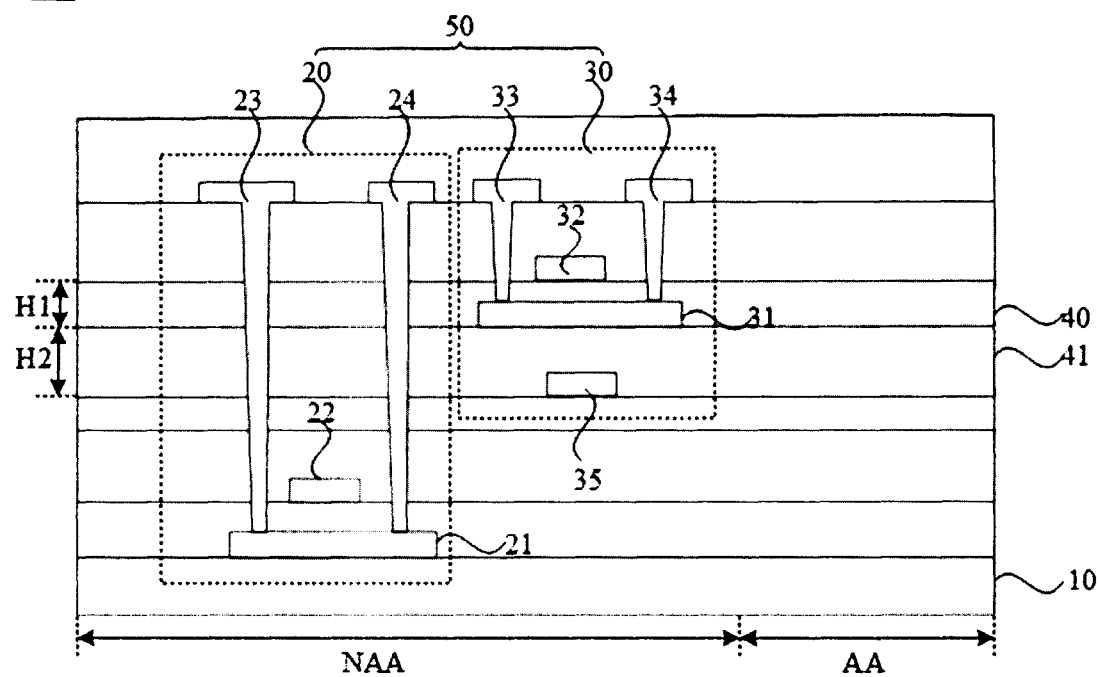
FIG. 7 is a diagram showing structures of a display panel according to another embodiment of the present disclosure.

Based on the same concept, an embodiment of the present disclosure further provides a display panel. FIG. 7 is a diagram showing structures of a display panel 700 according to another embodiment of the present disclosure. As shown in FIG. 7, display panel 700 provided by the embodiment of the present disclosure includes a base substrate 10, a first transistor 20, a second transistor 30, a first insulating layer 40, and a second insulating layer 41. The first transistor 20 and the second transistor 30 are formed on the base substrate 10. The first transistor 20 includes a first active layer 21, a first gate 22, a first source 23, and a first drain 24. The first active layer 21 contains silicon. The second transistor 30 includes a second active layer 31, a second gate 32, a third gate 35, a second source 33, and a second drain 34. The second active layer 31 contains an oxide semiconductor and is disposed on one side of the first active layer 21 facing away from the base substrate 10. The first insulating layer 40 and the second insulating layer 42 are located on two sides of the second active layer 31, respectively. The first insulating layer 40 is disposed between the second gate 32 and the second active layer 31. The second insulating layer 41 is disposed between the third gate 35 and the second active layer 31. The thickness H1 of the first insulating layer 40 is less than the thickness H2 of the second insulating layer 41. The concentration of oxygen in the first insulating layer 40 is lower than the concentration of oxygen in the second insulating layer 41. The display panel 700 includes a pixel circuit (not shown in FIG. 7) and a driver circuit 50 providing a drive signal for the pixel circuit. The driver circuit 50 includes at least one second transistor 30. FIG. 7 is illustrated by using an example in which the driver circuit 50 includes the first transistor 20 and the second transistor 30.

Referring to FIG. 7, when the second gate 32 is the main gate of the second transistor 30 and is the top gate of the second transistor 30, the thickness H1 of the first insulating layer 40 corresponding to the main gate is set to be less than the thickness H2 of the second insulating layer 41 corresponding to the assist gate, thereby ensuring the ability of the main gate to control the second transistor 30.

Figure 8:
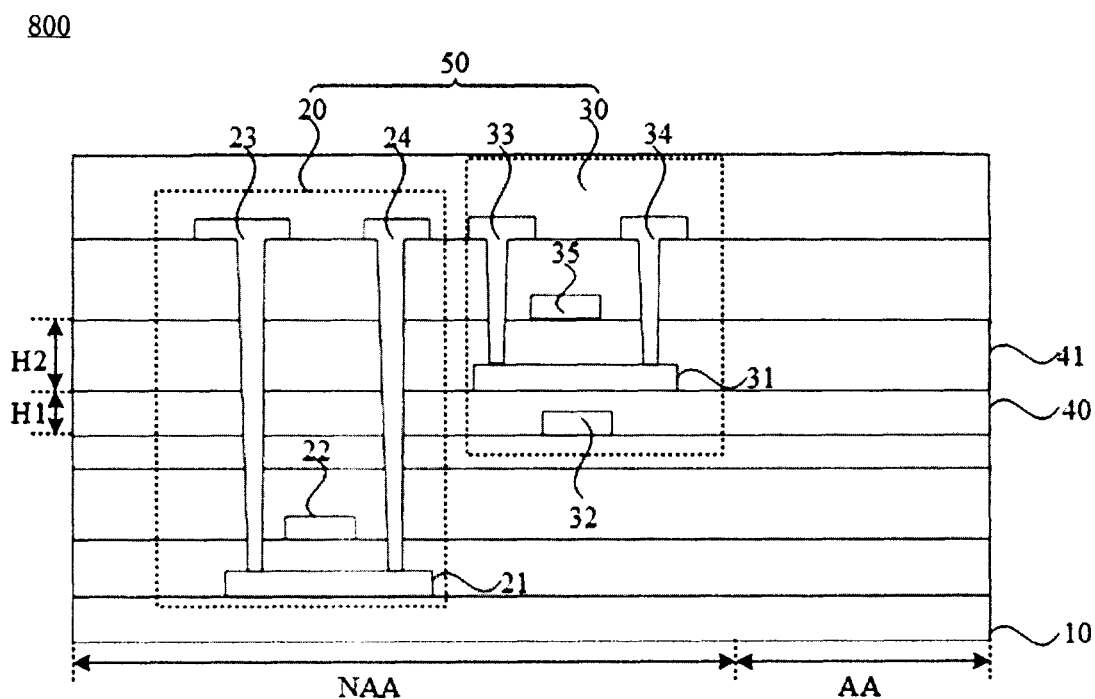
FIG. 8 is a diagram showing structures of a display panel according to another embodiment of the present disclosure.

FIG. 8 is a diagram showing structure of a display panel 800 according to another embodiment of the present disclosure. As shown in FIG. 8, when the second gate 32 is the main gate of the second transistor 30 and is the bottom gate of the second transistor 30, the thickness H1 of the first insulating layer 40 corresponding to the main gate is set to be less than the thickness H2 of the second insulating layer 41 corresponding to the assist gate to ensure the ability of the main gate to control the second transistor 30.

In the display panel provided by the embodiment of the present disclosure, the concentration of oxygen in the first insulating layer (that is, the insulating layer of the main gate) is lower than the concentration of oxygen in the second insulating layer (that is, the insulating layer of the assist gate), that is, the concentration of oxygen in the first insulating layer is appropriately reduced to avoid the influence of the deficiency in the first insulating layer on the second active layer. The concentration of oxygen in the second insulating layer is appropriately increased to ensure the normal function of the second active layer, thereby improving the stability of the second transistor and ensuring the good performance of the driver circuit. Meanwhile, the thickness of the first insulating layer (that is, the insulating layer of the main gate) is set to be less than the thickness of the second insulating layer (that is, the insulating layer of the assist gate) to ensure the ability of the main gate to control the second transistor.

Figure 9:
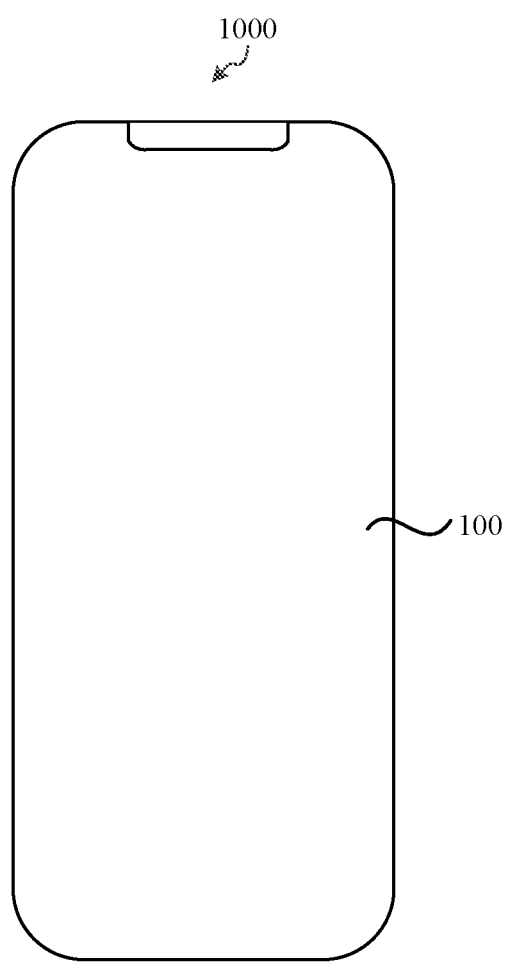
FIG. 9 is a diagram showing structures of a display device according to another embodiment of the present disclosure.

Based on the same concept, an embodiment of the present disclosure further provides a display device. The display device includes any display panel provided in the preceding embodiments. Exemplarily, as shown in FIG. 9, a display device 1000 includes the display panel 100. Therefore, the display device also has the beneficial effects of the display panel described in the preceding embodiments, and for the same details, reference may be made to the description of the preceding display panel, and repetition will not made herein.

A display device 1000 provided in accordance with the embodiments of the present disclosure may be the phone shown in FIG. 9, or may be any electronic product with a display function, including but not limited to: televisions, laptops, desktop displays, tablet computers, digital cameras, smart bracelets, smart glasses, in-vehicle displays, industry-controlling equipment, medical displays, touch interactive terminals, etc., which will not be specifically limited in the embodiment of the present disclosure.

It is to be noted that the preceding are merely preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
a base substrate;
a first transistor and a second transistor, wherein the first transistor and the second transistor are formed on the base substrate, wherein the first transistor comprises a first active layer, a first gate, a first source and a first drain, and wherein the first active layer comprises silicon; wherein the second transistor comprises a second active layer, a second gate, a second source, and a second drain, and wherein the second active layer comprises an oxide semiconductor and is disposed on one side of the first active layer facing away from the base substrate; and
a first insulating layer and a second insulating layer, wherein the first insulating layer is disposed on one side of the second active layer facing away from the base substrate and between the second gate and the second active layer, and wherein the second insulating layer is disposed on one side of the second active layer facing towards the base substrate,
wherein a concentration of oxygen in the first insulating layer is lower than a concentration of oxygen in the second insulating layer,
wherein the display panel comprises a pixel circuit and a driver circuit providing a drive signal for the pixel circuit, wherein the driver circuit comprises the second transistor, and wherein the pixel circuit comprises the first transistor or wherein the driver circuit comprises the first transistor, and
wherein the first insulating layer comprises silicon oxide $SiO_x$ and the second insulating layer comprises silicon oxide $SiO_y$, wherein x is a ratio of a number of oxygen atoms to a number of silicon atoms in the first insulating layer, wherein y is a ratio of a number of oxygen atoms to a number of silicon atoms in the second insulating layer, and wherein x<y.

2. The display panel of claim 1, wherein a ratio of the concentration of oxygen to a concentration of silicon in the first insulating layer is A, wherein a ratio of the concentration of oxygen to a concentration of silicon in the second insulating layer is B, and $A<B.$ 3. The display panel of claim 1, wherein
the second transistor comprises a third gate disposed on one side of the second insulating layer facing towards the base substrate, and wherein a thickness of the first insulating layer is less than a thickness of the second insulating layer.

4. The display panel of claim 3, wherein
in the second insulating layer, a concentration of oxygen on one side facing towards the second active layer is higher than a concentration of oxygen on one side facing away from the second active layer.

5. The display panel of claim 4, wherein
the second insulating layer comprises a first sub-insulating layer and a second sub-insulating layer, wherein the second sub-insulating layer is disposed on one side of the first sub-insulating layer facing away from the second active layer, wherein each of the first sub-insulating layer and the second sub-insulating layer comprises silicon oxide, and wherein a concentration of oxygen in the first sub-insulating layer is higher than a concentration of oxygen in the second sub-insulating layer.

6. The display panel of claim 5, wherein
a concentration of hydrogen in the second sub-insulating layer is higher than a concentration of oxygen in the first sub-insulating layer.

7. The display panel of claim 1, wherein
the display panel further comprises a third insulating layer disposed on one side of the second gate facing away from the base substrate, and wherein
a concentration of oxygen in the third insulating layer is higher than the concentration of oxygen in the first insulating layer.

8. The display panel of claim 7, wherein
the concentration of oxygen in the third insulating layer is lower than the concentration of oxygen in the second insulating layer.

9. The display panel of claim 7, wherein
a ratio of the concentration of oxygen to a concentration of silicon in the first insulating layer is A, wherein a ratio of the concentration of oxygen to a concentration of silicon in the second insulating layer is B, and wherein a ratio of the concentration of oxygen to a concentration of silicon in the third insulating layer is C, wherein $$(B-1) \le 2(C-1)-(A-1).$$

10. The display panel of claim 9, wherein $$(B-1)-(C-1) \le \tfrac{1}{2} \times [(C-1)-(A-1)].$$

11. The display panel of claim 1, wherein
the pixel circuit further comprises a third transistor, wherein the third transistor comprises a third active layer, a third source, a third drain, and a fourth gate, and the third active layer contains an oxide semiconductor; and
wherein the display panel further comprises a fourth insulating layer and a fifth insulating layer, wherein the fourth insulating layer is disposed on one side of the third active layer facing away from the base substrate and between the third active layer and the fourth gate, and wherein the fifth insulating layer is disposed on one side of the third active layer facing towards the base substrate, wherein
a concentration of oxygen in the fourth insulating layer is lower than a concentration of oxygen in the fifth insulating layer.

12. The display panel of claim 11, wherein
the third transistor is a switch transistor of the pixel circuit; and
wherein a difference between the concentration C1 of oxygen in the first insulating layer and the concentration C2 of oxygen in the second insulating layer is R1=C2−C1, wherein a difference between the concentration C4 of oxygen in the fourth insulating layer and the concentration C5 of oxygen in the fifth insulating layer is R2=C5−C4, and R1≥R2.

13. The display panel of claim 11, wherein
the third transistor is a switch transistor of the pixel circuit, and
wherein the concentration of oxygen in the first insulating layer is lower than the concentration of oxygen in the fourth insulating layer.

14. The display panel of claim 11, wherein
the third transistor is a drive transistor of the pixel circuit; and
wherein a difference between the concentration C1 of oxygen in the first insulating layer and the concentration C2 of oxygen in the second insulating layer is R1=C2−C1, and wherein a difference between the concentration C4 of oxygen in the fourth insulating layer and the concentration C5 of oxygen in the fifth insulating layer is R2=C5−C4, and wherein R1≤R2.

15. The display panel of claim 11, wherein
the third transistor is a drive transistor of the pixel circuit; and
wherein the concentration of oxygen in the first insulating layer is higher than the concentration of oxygen in the fourth insulating layer.

16. The display panel of claim 11, wherein
the display panel further comprises a fourth transistor, wherein the fourth transistor comprises a fourth active layer, a fourth source, a fourth drain, and a fifth gate, and wherein the fourth active layer contains an oxide semiconductor; and
wherein the display panel further comprises a sixth insulating layer and a seventh insulating layer, wherein the sixth insulating layer is disposed on one side of the fourth active layer facing away from the base substrate and between the fourth active layer and the fifth gate, and wherein the seventh insulating layer is disposed on one side of the fourth active layer facing towards the base substrate, wherein
a concentration of oxygen in the sixth insulating layer is lower than a concentration of oxygen in the seventh insulating layer.

17. The display panel of claim 16, wherein
the third transistor is a drive transistor of the pixel circuit, and wherein the fourth transistor is a switch transistor of the pixel circuit, wherein
a difference between the concentration C4 of oxygen in the fourth insulating layer and the concentration C5 of oxygen in the fifth insulating layer is R2=C5−C4, wherein a difference between the concentration C6 of oxygen in the sixth insulating layer and the concentration C7 of oxygen in the seventh insulating layer is R3=C7−C6, and wherein $$R2 \ge R3.$$

18. The display panel of claim 16, wherein
the third transistor is a drive transistor of the pixel circuit, and wherein the fourth transistor is a switch transistor of the pixel circuit, and
the wherein concentration of oxygen in the fourth insulating layer is lower than the concentration of oxygen in the sixth insulating layer.

19. A display panel, comprising:
a base substrate;
a first transistor and a second transistor, wherein the first transistor and the second transistor are formed on the base substrate, wherein the first transistor comprises a first active layer, a first gate, a first source, and a first drain, wherein the first active layer comprises silicon, wherein the second transistor comprises a second active layer, a second gate, a third gate, a second source, and a second drain, and wherein the second active layer comprises an oxide semiconductor and is disposed on one side of the first active layer facing away from the base substrate; and a first insulating layer and a second insulating layer, wherein the first insulating layer and the second insulating layer are disposed on two sides of the second active layer, respectively, wherein the first insulating layer is disposed between the second gate and the second active layer, wherein the second insulating layer is disposed between the third gate and the second active layer, and wherein a thickness of the first insulating layer is less than a thickness of the second insulating layer, wherein a concentration of oxygen in the first insulating layer is lower than a concentration of oxygen in the second insulating layer, wherein the display panel comprises a pixel circuit and a driver circuit providing a drive signal for the pixel circuit, wherein the driver circuit comprises the second transistor, and wherein the pixel circuit comprises the first transistor or wherein the driver circuit comprises the first transistor, and wherein the first insulating layer comprises silicon oxide $SiO_x$ and the second insulating layer comprises silicon oxide $SiO_y$, wherein x is a ratio of a number of oxygen atoms to a number of silicon atoms in the first insulating layer, wherein y is a ratio of a number of oxygen atoms to a number of silicon atoms in the second insulating layer, and wherein $x<y$.

20. A display panel, comprising:

a base substrate;

a first transistor and a second transistor, wherein the first transistor and the second transistor are formed on the base substrate, wherein the first transistor comprises a first active layer, a first gate, a first source and a first drain, and wherein the first active layer comprises silicon; wherein the second transistor comprises a second active layer, a second gate, a second source, and a second drain, and wherein the second active layer comprises an oxide semiconductor and is disposed on one side of the first active layer facing away from the base substrate; and a first insulating layer and a second insulating layer, wherein the first insulating layer is disposed on one side of the second active layer facing away from the base substrate and between the second gate and the second active layer, and wherein the second insulating layer is disposed on one side of the second active layer facing towards the base substrate, wherein a concentration of oxygen in the first insulating layer is lower than a concentration of oxygen in the second insulating layer, wherein the display panel comprises a pixel circuit and a driver circuit providing a drive signal for the pixel circuit, wherein the driver circuit comprises the second transistor, and wherein the pixel circuit comprises the first transistor or wherein the driver circuit comprises the first transistor, and wherein the second transistor comprises a third gate disposed on one side of the second insulating layer facing towards the base substrate, in the second insulating layer, a concentration of oxygen on one side facing towards the second active layer is higher than a concentration of oxygen on one side facing away from the second active layer.

* * * * *